United States Patent [19]

Nicolau

[11] Patent Number: 4,675,207
[45] Date of Patent: Jun. 23, 1987

[54] PROCESS AND APPARATUS FOR THE DEPOSITION ON A SUBSTRATE OF A THIN FILM OF A COMPOUND CONTAINING AT LEAST ONE CATIONIC CONSTITUENT AND AT LEAST ONE ANIONIC CONSTITUENT

[75] Inventor: Yann F. Nicolau, St. Nazaire-les-Eymes, France

[73] Assignee: Commissariat a l'Energie Atomique, Paris, France

[21] Appl. No.: 765,123

[22] Filed: Aug. 13, 1985

[30] Foreign Application Priority Data

Aug. 23, 1984 [FR] France .................................. 84 13118

[51] Int. Cl.$^4$ ........................... C30B 7/00; B05D 1/38
[52] U.S. Cl. ...................................... 427/82; 156/600; 156/621; 427/87; 427/402; 427/419.1; 427/419.2; 427/419.7; 427/430.1; 427/435
[58] Field of Search .................. 427/402, 419.1, 419.2, 427/419.7, 430.1, 435, 82, 87; 156/600, 621

[56] References Cited

U.S. PATENT DOCUMENTS 3,466,190  9/1969  Yamushita et al. ..................... 427/74
4,061,930  12/1977  Greenberg .......................... 428/469

OTHER PUBLICATIONS

R. N. Bhattacharya et al., "New Chemical Methods for the Deposition of $Cu_{1.8}S$ and TlSe Thin Film", *Bull. Mater. Sci.*, vol. 3, No. 4, Dec. 1981, pp. 403–405, 407, 408.

N. R. Pavaskar et al, Photoconductive Films by a Chemical Bath Deposition Process, *Solid-State Science and Technology*, May 1978, pp. 743–748.

Y. F. Nicolau, Solution Deposition of Thin Solid Compound Films by a Successive Ionic-Layer Adsorption and Reaction Process, Applications of Surface Science 22/23 (1985) pp. 1061–1074.

*Primary Examiner*—John D. Smith
*Attorney, Agent, or Firm*—Oblon, Fisher, Spivak, McClelland & Maier

[57] ABSTRACT

The invention relates to a process for the depositing on a substrate a thin film or layer of a compound having at least one cationic constituent C and at least one anionic constituent A, such as zinc sulphide.

On the substrate are formed at least two superimposed ionic layers respectively incorporating the said cationic constituent or constituents C and the said anionic constituent or constituents A by successively immersing the substrate in a first solution e.g. containing a salt of C, such as zinc sulphate and in a second solution eg containing a salt of A, such as sodium sulphide, while rinsing the substrate between two immersion operations.

22 Claims, 4 Drawing Figures

PROCESS AND APPARATUS FOR THE DEPOSITION ON A SUBSTRATE OF A THIN FILM OF A COMPOUND CONTAINING AT LEAST ONE CATIONIC CONSTITUENT AND AT LEAST ONE ANIONIC CONSTITUENT

BACKGROUND OF THE INVENTION

The present invention relates to a process and apparatus for depositing on a substrate a thin film of a compound having at least one cationic constituent and at least one anionic constituent.

More specifically, it relates to a process for the deposition of monocrystalline or polycrystalline, fault-free, compact layers or films having a homogeneous thickness and stoichiometric composition, which can be used for producing light-emitting diodes and screens, solar cells and components for optoelectronics, infrared detection and magnetic recording. It more particularly relates to the deposition of compounds of formula $C_mA_n$ in which C represents a cation, A represents an anion which can be an oxyanion or a polyoxyanion, m is the valence of the anion and n the valence of the cation.

Among the presently known processes for the deposition of thin monocrystalline or polycrystalline films on a substrate, reference can be made to the processes using vapour phase deposition and those using deposition in solution.

The vapour deposition methods include vacuum depositing processes by thermal evaporation or electron bombardment, by cathodic sputtering, by pyrolysis, or by chemical deposition (CVD) under the effect of the temperature or a discharge under a high DC voltage or a high frequency, as well as deposition processes under ultra-high vacuum by epitaxy using molecular and/or atomic beams.

The methods of deposition in solution include deposition processes by chemical reaction and processes by electrolysis. Most of these processes make it possible to obtain compact, polycrystalline layers under good conditions, but they are not very suitable for producing layers of compounds of formula $C_mA_n$, in which A is an oxyanion or polyoxyanion. Moreover, it is difficult to check the stoichiometry of the deposited compounds and the thickness of the layer. Finally, the deposition of monocrystalline layers is virtually impossible to obtain with most of these processes. Thus, vacuum deposition processes using thermoevaporation or electron bombardment are difficult to perform and check, because the starting compounds used for this deposition partly or totally decompose hot into elements having different vapour pressures.

Thus, the stoichiometry of the deposited compounds is often difficult to reach and the thickness is difficult to check, particularly over large surfaces. In most cases, a polycrystalline deposit is obtained having pores and defects. Moreover, vacuum deposition processes cannot be used for depositing compounds such as phosphates, arsenates, chromates and carbonates.

Vapour phase chemical deposition processes (CVD) involve chemical reactions having complicated kinetics and thermodynamic equilibria, which often makes it necessary to synthesise and purify particular organometallic compounds, which are often toxic, inflammable and difficult to handle. Moreover, the by-products of the reaction contaminate the deposit, particularly carbon, oxygen and halogens. As in the case of vacuum deposition, the thickness and uniformity of the thickness are difficult to check, because they are dependent on the kinetics of the reactions in surface and volume, the temperature uniformity at high temperatures and the hydrodynamics of the gasses. The layers obtained, which can be amorphous or polycrystalline, often have a porosity and epitaxial layers can only be deposited under special conditions aiding the surface heterogeneous autocatalysis, which generally requires the use of a hot substrate in a cold tube and causes problems with respect to the uniformity of temperature. In the same way, these processes are not suitable for the deposition of compounds of formula $C_mA_n$, in which A is an oxyanion or a polyoxyanion.

Deposition processes under ultra-high vacuum by molecular beams make it possible to obtain layers with a good crystalline quality, whose thickness and stoichiometry can be checked, which are easy to dope, but whose growth rate is low and it is also necessary to use complex, onerous equipment. Moreover, these processes are not suitable for the deposition of layers of compounds containing oxyanions or polyoxyanions.

Deposition processes by chemical reaction in solution, like that described in French Pat. No. 2 138 410 giving rise to double decompositions reactions in solution, are easy to perform between ambient temperature and 100° C. and are also extremely economic. It is difficult to check the thickness of the layers, but the uniformity is good, the layers being obtained being stoichiometric and their doping is easy. However, this process can only be used with certain chalcogenides and metals, because it is difficult to find slow heterogeneous chemical reactions aiding the deposition coinciding with the homogeneous chemical reaction producing a precipitate.

Processes by electrolysis can only be carried out with certain conductive compounds, such as nickel sulphide or cobalt sulphide, or semiconductor compounds such as cadmium telluride. Deposition can be obtained by annodic oxydation, cathodic reduction or cathodic codeposition, but the thickness and stoichoimetry of the layers are difficult to check. Moreover, the layers often have cracks, incorporate impurities and it is not possible to obtain monocrystalline layers.

Thus, none of the known processes can lead to the obtaining of polycrystalline or monocrystalline layers of compounds of varied types, particularly compounds containing oxyanions or polyoxyanions.

SUMMARY OF THE INVENTION

The present invention therefore specifically relates to a process for the deposition on a substrate of a thin film of easy to perform, which makes it possible to obtain compact, polycrystalline or monocrystalline layers of stoichoimetric compounds more particularly containing oxyanions or polyoxyanions.

The preset invention therefore specifically relates to a process for the deposition on a substrate of a thin film of a compound containing at least one cationic constituent C and at least one anionic constituent A, wherein it comprises forming on said substrate at least two superimposed ionic layers respectively containing the cationic constituent or constituents C and the anionic constituent or constituents A by successive immersions of the substrate in at least one first solution containing at least one salt, a complex or an ionized compound of said cationic constituent or constituents C or a precursor of said cationic constituent or constituents C, and at least one second solution containing at least one salt, a complex or an ionized compound of said anionic constituent or constituents A or a precursor of said anionic constituent or constituents A, said substrate undergoing rinsing by a solvent between two immersions.

In this process, the growth of the thin film of the compound take place by heterogeneous chemical reaction at the substrate-solution interface between cations C and anions A adsorbed on the substrate. Thus, on immersing the substrate in the first solution, which e.g. contains an ionized salt of the cationic constituent C, there forms on the substrate a double electrical layer of the Helmholtz type comprising a cationic layer of the cationic constituent C and an anionic layer of the anion of the salt present in the first solution.

The arrangement of the cationic and anionic layers with respect to the substrate is dependent on the nature thereof and it is consequently possible to have either the cationic layer or the anionic layer in contact with the substrate.

Following this first immersion, the excess solution adhering to the substrate is eliminated during rinsing by convection and diffusion. On then immersing the substrate in the second solution, the anionic constituent A and the cation associated therewith in the second solution pass through the limit solvent layer adhering to the substrate and penetrate the Helmholtz layer. At this moment there are exchanges in the Helmholtz layer, whereof the structure changes by reaction between the cationic constituents C and the anionic constituent A which have been adsorbed, the anionic constituents discharge and the thus adsorbed atoms which have just reacted diffuse at the surface and give rise to monocrystalline grains occupying their characteristic site in the lattice of the compound. The cationic and anionic components of constituents C and A are moved by the growth towards the diffuse part of the double electric layer and they partly diffuse towards the solution, which makes it possible to eliminate them during the following rinsing stage.

According to a first embodiment of the process according to the invention, this comprises at least one cycle consisting of the of the following successive stages:

immersion of the substrate in a first solution of a salt, a complex or an ionized compound of said cationic constituent, rinsing the substrate with a solvent, immersion of the substrate in a second solution of a salt of a compound or an ionized complex of said anionic constituent, and rinsing the said substrate in a solvent.

By successively repeating these cycles, growth is brought about of the layer of the compound obtained by reacting the cationic constituent C with the anionic constituent A from successive ionic layers adsorbed on the substrate.

According to a variant of the process according to the invention, the formation of the ionic layers containing the cationic constituent or anionic constituent takes place on the basis of a precursor of said constituents, which is then converted into the anionic constituent or cationic constituent by the action of an oxydizing agent or reducing agent. Thus, in the case where it is wished to form the layer of the cationic constituent from a precursor thereof, the substrate is firstly immersed in a first solution of a salt, a compound or an ionized complex of a precursor of said cationic constituent. The substrate is then rinsed with a solvent and the rinsed substrate is then immersed in a solution containing an oxydizing or reducing agent able to convert said precursor into said cationic constituent.

The oxydizing agent can be supplied by adsorbtion of a hydroxyl and a deprotonation by attachment to the substrate surface.

In the case where it wished to obtain the anionic constituent from a precursor, the substrate is immersed in a second solution of a salt, a complex or an ionized compound of a precursor of the anionic constituent, followed by the rinsing of the substrate with a solvent and the immersion of the rinsed substrate in a solution containing an oxydizing or reducing agent able to convert the precursor into said anionic constituent.

The process according to the invention can be used for the growth of a layer of a ternary or quaternary compound of type $C_m A_n$. In this case, it is possible to use the other doping anionic constituent and/or cationic constituent by adding them respectively to the first and second solutions in the form of a salt, compound or complex of said constituent or a precursor of said constituent. It is also possible to periodically carry out a complementary cycle consisting of forming an ionic layer of the complementary doping anionic or cationic constituent by immersing the substrate in a third solution of a salt, a complex or an ionized compound of said doping agent or a precursor agent thereof. In the latter case, the process can comprise at least one complementary cycle consisting of the stages of immersing the substrate in a third solution of a salt, a complex or an ionized compound of a cationic or anionic dopant and rinsing said substrate with a solvent.

According to an advantageous arrangement of the process according to the invention, which applies solely in the case where the substrate and compound to be deposited are electricity conductors or semiconductors, it is possible to increase the degree of covering of the sites of the layer in the course of growth by the anionic constituent and/or cationic constituent, by positively polarizing the substrate with respect to the solution during the immersion thereof in the second solution containing the anionic constituent and by negatively polarizing the substrate relative to the solution during the immersion of the substrate in the first solution. When the process comprises the use of at least one third solution for the deposition of a cationic dopant and/or the deposition of an anionic dopant, it is possible to positvely or negatively polarize the substrate during the immersion thereof in said third solution, so as to aid the formation and covering of the substrate by the ionic dopant layer or layers. In all cases, the voltage applied must be less than that leading to the decomposition of the salt, complex or compound present in the solution, so as not to bring about electrolysis of said solution.

According to the invention, the concentrations in salt, compound or complex of the solutions are chosen as a function of the growth rate which it is wished to obtain. Thus, when using concentrated solutions, the number of immersions necessary for obtaining the desired layer thickness can be less than in the case of dilute solutions, because during each immersion there is a greater occupation of the sites by adsorbtion. However, the polycrystalline layers obtained in this case are rough, have large grains and little adhesion. When using more dilute solutions, it is necessary to carry out a larger number of immersions, but the polycrystalline layers obtained have better properties. Thus, they have fine grains, are compact and are adhesive. It is normal practice to use concentrations of salt, compound or complex of said cationic or anionic constituents or a precursor thereof of approximately $10^{-3}$ at 1 mol.l$^{-1}$.

The substrate immersion times in the solutions are such that adsorbtion equilibrium is approached between the substrate and the solution. In general, times of 5 to 120 s and preferably 15 to 60 s are used.

The rinsing time is such that there is a complete elimination by convection and diffusion of the excess solution adhering to the substrate, as well as the secondary products of the reaction, but rinsing must not be excessive, in order not to excessively disturb the organisation of the double electrical layer formed on the substrate during immersion in the solution. Therefore the rinsing time varies as a function of the solvent flow rate, the dimensions of the substrate, the container used for rinsing purposes and the nature of the substrate and the solutions.

Generally, rinsing takes place for a time such that the solvent flowing out at the end of the rinsing operation has the same resistivity as the solvent introduced for rinsing purposes. Thus, the resistivity of the solvent drops at the start of rinsing and then returns to the initial value, which is advantageously approximately 16M 106 cm.

More specifically, the duration of the rinsing following immersion in the solution containing the salt of the cation of the compound is conditioned by the time necessary for the diffusion of the salt of the cation through the limited solvent layer (or diffusion layer) adhering to the substrate. The residual admissible concentration of the cation in said layer $[C]_r$ must satisfy the relation $$[C]_r^n < \frac{SpCmAn}{[A]^m}$$

in which SpCmAn is the solubility product of the compound to be deposited and [A] is the concentration of the anion of the compound in the solution of the anion salt.

The same condition must be observed for the residual concentration of the anion of the compound $[A]_r$ $$[A]_r^m < \frac{SpCmAn}{[C]^n}$$

in order to prevent the precipitation of the compound in the limit solvent layer at the time of the immersions. For example, the rinsing time is generally 60 to 120 s.

When using immersion and rinsing times within the ranges indicated hereinbefore with solutions having the aforementioned concentrations, a growth rate below 0.1 $\mu$m/h is obtained. Thus, the process according to the invention does not make it possible to reach high growth rates, but it lends itself very well to industrialisation because by increasing the dimensions of the substrates, it is possible to reach growth rates related to the surface unity of the substrates which are comparable to those obtained with other processes.

The substrates used in the process according to the invention can be of any random type, provided that they are soluble or degradable in the solvents and solutions used. However, the adhesion of the layer is dependent on the nature of the substrate and the compound to be deposited, the surface treatment of the substrate prior to deposition and possibly complementary treatments which can be carried out after deposition.

As examples of substrates which can be used, reference is made to glass substrates, metallic substrates, e.g. of Mo, W, Ti or Ni, plastic substrates, e.g. of polyacrylates, polycarbonates, polyamides or polyvinyls, monocrystalline metallic substrates, e.g. of Zn or Cd, monocrystalline semiconductor substrates, e.g. of Ge, GaAs or InP and monocrystalline dielectric substrates, e.g. of $SiO_2$, $Al_2O_3$, $TiO_2$ or $LiNbO_3$.

When it is wished to obtain monocrystalline layers of the compound, use is made of a substrate made from said compound and having a given orientation.

The solutions used for the formation of ionic layers are preferably aqueous solutions in which the salts, complexes or compounds are dissociated into ions. Water is advantageously used for rinsing purposes and preferably has a resistivity of at least 16M$\Omega$-cm, but other solvents can be used, both for the rinsing and for the formation of solutions containing the cationic and anionic constituents or precursors thereof.

Thus, it is possible to use organic solvents or mixtures of water and organic solvent, obviously provided that for the ionic layer formation operations, the salts, compounds or complexes present in these solutions can be in the dissociated state. When the solutions contain several cationic or anionic constituents, the concentrations of these different constituents are chosen as a function of the composition of the layer to be deposited. In the solutions, the cationic or anionic constituents can be present in the form of a complex with an appropriate ligand, which is soluble in the solution. For example, this ligand can be ammonia. In these solutions, the anionic or cationic components of the salts or complexes are chosen in such a way as to aid the formation of compound $C_mA_n$ by double decomposition reaction.

The pH of the solutions is adjusted by means of an acid or a base to the pH range within which only the compound to be deposited precipitates by mixing the two solutions, whereas the salts, compounds or complexes present in each solution remain soluble therein.

The process according to the invention can be performed for depositing various compounds of type $C_mA_n$ and more particularly applies to compounds in which the anion A is an oxyanion or a polyoxyanion. Examples of compounds of this type which can be deposited by the process according to the invention, reference can be made to chalcogenides, oxides, hydroxides, phosphates, chromates, molybdates, titanates, vanadates, tungstates, silicates, carbonates and oxalates of a metallic nature.

Thus, the process according to the invention is of particular interest because it applies to numerous compounds, which was not the case with the prior art processes.

Moreover, it makes it possible to obtain stoichiometric compounds and the layers obtained are compact and have no porosity. They can be monocrystalline or polycrystalline as a function of the nature of the substrate used, can be uniformly doped, have thicknesses between 100 and 20,000 Å to within 1 or 10% with a thickness uniformity in the tolerance range 1 to 10% and have large grains extending e.g. up to 0.5 $\mu$m for 0.5 $\mu$m films deposited on glass.

This process can be used with large surface substrates of approximately 10 to 1,000 cm$^2$, because the surface is solely limited by the volume of the equipment, i.e. containers containing the solutions and rinsing water. The substrates can also have a random shape seeing that it is possible to rinse them under good conditions.

The process according to the invention is easy to perform, because it neither requires heating nor complex equipment. Moreover, it is possible to work at ambient temperature under atmospheric pressure. It applies to the deposition of compounds uniformly doped by a cation or anion, compounds constituted by solid ternary or quaternary solutions, solid solutions of compounds having solubility gaps within the immiscibility range, solid solutions of compounds having a limited solubility below their mutual solubility and solid solutions of totally insoluble compounds. Thus, this can be obtained by introducing supplementary cations and/or anions into the different solutions or by carrying out complementary immersion cycles of the substrate in a solution containing the cation or cations and/or in a solution containing the anion and/or anions which are to be added.

The process according to the invention also makes it possible to obtain superlattices by introducing the doping element at certain instants, in order to obtain a mesh constant nd, in which d is the interplanar crystal spacing of the compound in the growth direction and n represents the number of immersios performed prior to the complementary cycle of introducing the doping element.

It is also possible to obtain a thick multilayer structure by effecting successive numbers of immersion cycles in different solutions, each making it possible to deposit one layer of the desired multilayer structure.

By appropriately choosing the substrate, e.g. by using a monocrystalline substrate of the same nature as the compound and by respecting the special orientation conditions of the compound, it is possible to deposit a homoepitaxial layer by the process according to the invention. However, a heterepitaxial layer is deposited when using a substrate of a different nature, but which has the same crystal mesh as that of the compound to be deposited, as well as an appropriate orientation and a surface which can be retained in the solutions. When the substrate is polycrystalline or amorphous, a polycrystalline layer is obtained.

The invention also relates to an apparatus for depositing thin films or layers on a substrate by successive immersions of the substrate in different solutions, wherein it comprises a plate supporting a plurality of containers for containing said solutions, means for supporting a plurality of substrates to be coated, said means being arranged with respect to the plate in such a way that by displacement in translation and/or rotation of said support means and/or said plate, each of the substrates to be coated is immersed in one of the said containers and means for displacing in translation and/or rotation the said support means and/or said plate.

This apparatus is particularly appropriate for performing the process according to the invention, because it makes it possible to simultaneously treat several substrates. Thus, by displacing the plate or support means in translation, it is possible to immerse the substrate in the containers and after displacing in translation and/or rotation the support means and/or the plate, it is possible to continue the treatment in another container.

Preferably, the plate is fixed and the support means are constituted by a shaft which is movable in translation and in rotation, equipped with fixing means for each of the said substrates. Generally, the shaft is vertical and has several horizontal arms in a star-like arrangement, on the ends of which are suspended the substrates.

In this case, the plate is circular and the containers are arranged in a circle on the plate, every other container being used as a rinsing container, so that each container containing a solution is surrounded by two rinsing containers, so that there is consequently an even number of containers.

The apparatus preferably also comprises a cover, which can fit over the plate so as to form therewith a tight enclosure containing the substrates and the containers and means for circulating an inert gas in said enclosure, which makes it possible to carry out deposition under a controlled atmosphere. The inert gas can in particular be nitrogen or argon.

The containers used for the rinsing are generally equipped with means for circulating a rinsing solvent in said containers. Their shape is preferably adapted to that of the substrates to be treated, so as to circulate the solvent under laminar operating conditions within the containers, preferably from bottom to top. The solvent which has been used for rinsing purposes can then be purified before being recycled for a new rinsing operation.

Advantageously, the apparatus also comprises means for measuring the degree of purity of the rinsing solvent, said means being constituted by conductivity measuring cells and by specific electrodes for measuring the residual concentrations of the anion and the cation of the compound. It is also possible to determine the pH within the containers by placing therein a calomel reference electrode or a glass membrane electrode. It is possible to determine the anion and cation concentration of the compound by placing specific measuring electrodes within the containers.

The apparatus can also comprise means for positively or negatively polarizing said substrates when they are immersed in certain of the said containers.

BRIEF DESCRIPTION OF THE DRAWINGS

Other features and advantages of the invention can be gathered by reading the following description of non-limitative embodiments with reference to the attached drawings, wherein show.

DETAILED DESCRIPTION OF THE PREFERRED EMBODIMENTS

Figure 1:
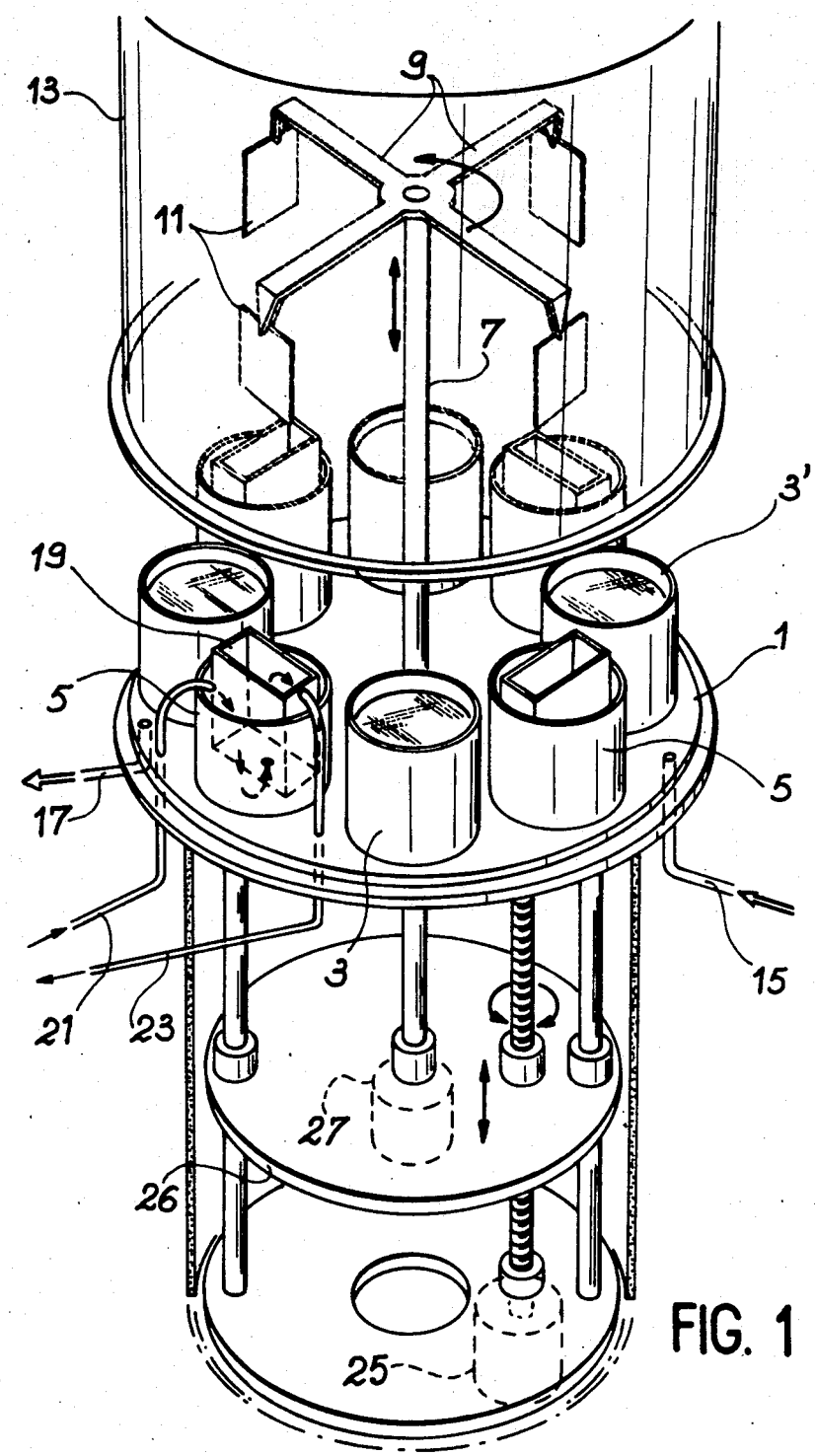
FIG. 1 the apparatus according to the invention in vertical section.

FIG. 1 shows that the apparatus comprises a fixed circular plate 1 on which are arranged 2n containers alternately formed by containers 3, 3' able to receive aqueous solutions of salt, complex or compound of the cationic or anionic constituent and containers 5 constituting rinsing containers. A shaft 7 mobile in translation and rotation relative to plate 1 has two horizontal arms 9 arranged in star-like manner and on the end of which are suspended the substrates 11 to be coated. A cover 13 can be fitted to the plate 1 and has a shape such that it forms with assembly 1 a tight enclosure containing containers 3, 3' and 5, shaft 7 and arms 9 supporting the substrates 11. Means which are not shown in the drawings make it possible to circulate an inert gas stream within the enclosure, said gas being introduced by pipe 15 and discharged by pipe 17 and/or pipes 23.

As can be seen from the drawings, the rinsing containers 5 are internally provided with tanks 19 having a shape adapted to that of the substrate to be treated which, in the present case is a rectangular substrate. Tanks 19 have a parallelipedic shape with a rectangular cross-section and a slightly greater thickness than that of the substrates to be coated, in such a way that the water can flow into said tanks under laminar conditions. The water is introduced by pipes 21 provided with not shown flow meters at the bottom of the rinsing tanks 10 and it is discharged by pipes 23. On discharge, the water is purified before being recycled in pipes 21. Conductivity measuring cells are engaged on the pipes 23 for measuring the conductivity of the water leaving the rinsing tanks 19 and prior to its introduction into the purification station. It is also possible to have specific electrodes in these pipes. Reference calomel electrodes or glass membrane electrodes for measuring the pH-value, together with specific electrodes can be arranged in containers 3, 3' containing the solutions used for deposition purposes.

Sliding electric contacts on shaft 17 make it possible to connect each substrate 11 to a power supply, if desired. Thus, via these electric contacts and reference electrodes, it is possible to polarize the substrates with respect to the solutions contained in containers 3, 3', when the substrates and the compounds to be deposited are electricity conductors or semiconductors.

The apparatus can be controlled by an electronic programmer, which makes it possible to control a repetative cycle of immersions and rinsings of the substrates, i.e. controls the passage of the substrates successively into containers 3, 5 and 3' with given residence times in each of the containers.

For example, an apparatus of this type was made from polyvinyl chloride by using polypropylene containers 3, 3' and 5 with a volume of 250 ml, rinsing tanks 19 having a rectangular crosssection of 20 to 50 mm and a height of 70 mm. The stainless steel shaft has a diameter of 10 mm and slides within a tight polytetrafluoroethylene bearing, whilst being actuated in translation by a stepping motor 25 able to impart a translation movement to the plate 26 supporting the shaft, via a ball screw and two diameter 10 mm stainless steel rails acting as a displacement guide for precision ball bushes. The rotary movement of the shaft is imparted by a stepping motor 27. Optical forks act as end of travel limiters, the vertical travel of the shaft being e.g. 100 mm, the shaft rotation speed 0.1 rps and the translation speed 2 cm/s. The equipment diameter is 400 mm and the total height 500 mm. It makes it possible to treat a maximum of 4 substrates at once, each having a maximum surface of 75×40 mm.

The following examples illustrate the invention in a non-limitative manner.

EXAMPLE 1

This example illustrates the use of the aforementioned apparatus for depositing a zinc sulphide layer on glass substrates constituted by microscope glass plates of 26×76 mm.

In this case, the first solution for the formation of the ionic layer containing the zinc is constituted by an aqueous zinc sulphate solution of 0.005 mol.l$^{-1}$ and a pH 3.9. The second solution for the formation of the layer containing S is an aqueous solution of Na$_2$S of 0.005 mol.l$^{-1}$ and a pH of 11.6. Deionized water with a resistivity of 16MΩ.cm is circulated in the rinsing tanks.

The surfaces of the glass plates are firstly cleaned using a cleaning agent, such as that marketed under the trade name Decon 90 by Prolabo and an ultrasonic apparatus. The plates are then attached to the arms 9 of shaft 7. The zinc sulphate solution is then introduced into the two containers 3 to the left of the rinsing tanks 5 and the sodium sulphide solution is introduced into the containers 3' to the right of rinsing tanks 5. Cover 13 is then closed and nitrogen is circulated within the apparatus. This is followed by the immersion of the substrates in containers 3 or 3' containing the zinc sulphate or sodium sulphide solutions and they are kept there for 40 seconds. After this by a translation and rotation movement of shaft 7, the substrates are immersed in the rinsing containers 5, whilst regulating the rinsing time and the rinsing water flow rates, in such a way that at the end of rinsing the rinsing water leaving tank 19 has a resistivity of 16MΩ.cm and the residual anion and cation concentrations of the compound in the limiting water layer adhering to the substrate do not lead to the precipitation of the compound in said layer. For a rinsing water flow rate in the rinsing tanks 5 following the zinc sulphate solutions of 30 l/h and a rinsing water flow rate in the rinsing tanks following the containers containing the Na$_2$S solution of 30 l/h, the rinsing time is 80 s. Following this rinsing operation, shaft 7 is again displaced again in translation and rotation for introducing substrates 11 into containers 3 or 3' and they are kept there for 40 s. These operations are continued until the desired layer thickness is obtained. Thus, for each immersion, approximately 0.6 Å of ZnS is deposited.

The layers obtained under these conditions and which correspond to a growth rate of 0.0016 μm/h are stoichiometric zinc sulphide layers having a cubic structure, a high resistivity, which are compact, polycrystalline, have no preferred orientation of the grains and which are of optical quality as regards the brightness and transparency.

Figure 2:
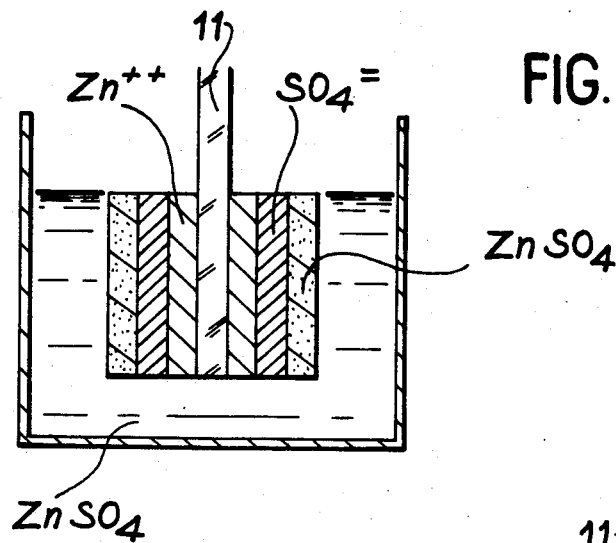
FIGS. 2, 3 and 4 diagrammatically the formation of the layer of the compound from ionic layers formed successively on the substrate.
Figure 3:
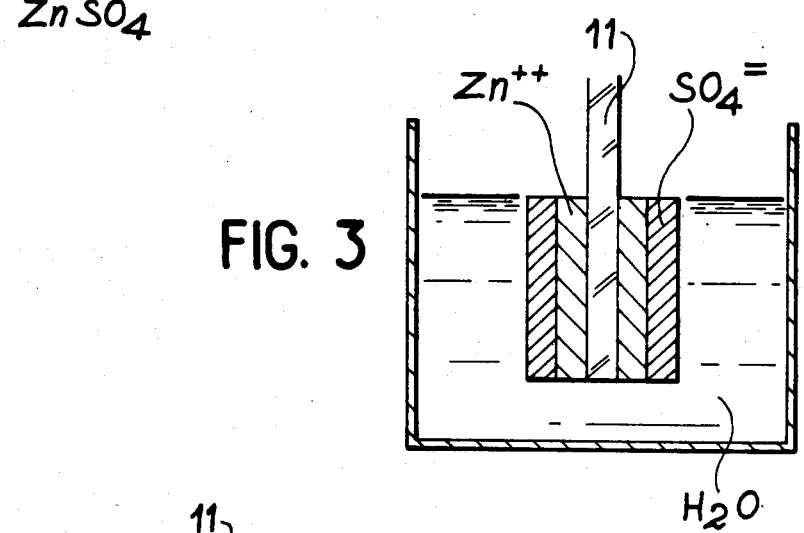
Figure 4:
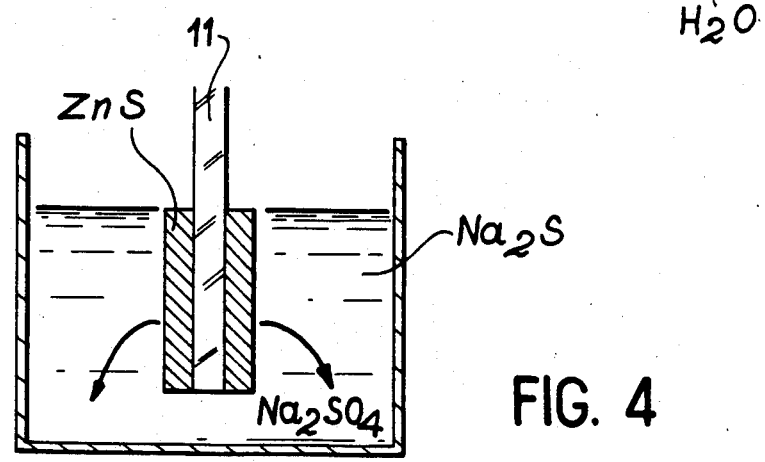

FIGS. 2, 3 and 4 diagrammatically show the formation of the ionic layers and the layer deposited at the end of the immersion of the glass plates 11 in the zinc sulphate solution and then in the sodium sulphide solution.

As shown in FIG. 2, during the immersion of substrate 11 in the zinc sulphate solution on the substrate is formed a double electric layer of the Holmholtz type containing a Zn$^{2+}$ layer followed by a SO$_4^{2-}$ layer and a diffuse zinc sulphate layer.

During the following rinsing, the diffuse limit layer of zinc sulphate is eliminated and, as shown in FIG. 3, a double electric layer is obtained formed from a Zn$^{2+}$ layer and a SO$_4^{2-}$ layer. During the following immersion in the sodium sulphide solution, the Na$^+$ and S$^{2-}$ ions penetrate the double ionic layer and by reaction in the layer there is a diffusion of dissolved sodium sulphate and the formation of a zinc sulphide layer on the substrate as shown in FIG. 3.

EXAMPLE 2

This example relates to the production of epitaxial layers of CdS[001] on monocrystalline substrates of InP[111] of diameter 40 mm.

In this case, the first solution is an aqueous cadmium sulphate solution of 0.005 mol.l$^{-1}$ and which is at pH 2.8. The second solution is an aqueous Na$_2$S solution of 0.005 mol.l$^{-1}$ and which is at pH 11.6. Deionized water with a resistivity of 16MΩ.cm is used for rinsing purposes.

The InP monocrystalline substrates with a thickness of 1 mm are firstly ground, polished and cleaned with a 1% Br-methanol solution. For growth purposes, use is made of the same apparatus as in example 1 and the monocrystalline InP substrates are immersed in containers 3 or 3' for 40 seconds and then undergo rinsing as in example 1 for 80 seconds, once again using a rinsing water flow rate of 30 l/h. Under these conditions, a growth rate of 0.3 Å/ immersion of the CdS face [0001] on [111] InP and 0.6 Å/immersion for the CdS face [000$\bar{1}$] on [$\bar{1}\bar{1}\bar{1}$] InP. Under these conditions, the layer growth rate is 0.0016 μm/h, as in example 1.

EXAMPLE 3

This example relates to the deposition of a zinc sulphide layer on a glass substrate identical to that of example 1. In this example, a ZnS layer is grown on a glass substrate under the same conditions as those of example 1 until an approximately 200 Å layer is obtained, which makes it possible to obtain a homogeneous, compact deposit which adhers well to the glass. However, as in example 1, the growth rate is low under these conditions. In addition, once the substrate has been covered with this 200 to 300 Å ZnS layer, growth is continued using other deposition conditions, namely a first aqueous zinc sulphate solution with a zinc sulphate concentration of 2 mol.l$^{-1}$ and a pH of 5.5 and a second Na$_2$S solution with a Na$_2$S concentration of 2 mol.l$^{-1}$. The zinc sulphide layer growth is continued by operating as in example 1, but using immersion times of the substrate in the first and second solutions of 20 s and rinsing times of 80 s with water flow rates of 120 l/h. Under these conditions, during each immersion is deposited approximately 2.5 Å of ZnS, which gives a growth rate of 0.008 μm/h, i.e. a rate which is twice as high as that of example 1.

On replacing the rinsing tanks operating under lamina conditions by tanks having nozzles operating under turbulent conditions with a water flow rate of 120 l/h and rinsing times of 20 s, a growth rate of 0.017 μm/h is obtained, i.e. a growth rate ten times higher than that of example 1.

EXAMPLE 4

This example illustrates the deposition of a Mn-doped ZnS layer on a glass substrate. In this example, use is made of the same substrate and the same operating procedure as in example 3, apart from the fact that at least one of the two solutions contains a manganese compound. It is possible to introduce the manganese in the form of MnSO$_4$ or KMnO$_4$ into the ZnSO$_4$ solution. Thus, the manganese is incorporated into the ZnS layer in the form of MnS, either from MnSO$_4$ by the following double exchange reaction:

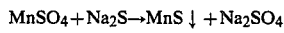

or from KMnO$_4$ by the following two-stage redox reaction:

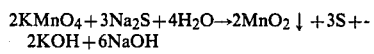

The first redox reaction deposits MnO$_2$ on the ZnS layer in the solution of KnSO$_4$+KMnO$_4$. The second redox reaction converts the MnO$_2$ into MnS in the solution of Na$_2$S. The sulphur dissolves in the Na$_2$S solution to form Na$_2$S$_2$.

On using MnSO$_4$, ten to one hundred times more MnSO$_4$ is introduced into the ZnSO$_4$ solution than indicated by the desired Mn/Zn molar ratio in the ZnS layer. When using KMnO$_4$, ten to one hundred times more KMnO$_4$ is used than is indicated by the desired Mn/Zn molar ratio. The layers obtained under these conditions have the characteristic luminescence of Mn$^{2+}$ in the yellow. The growth rate is of the same order of magnitude as that of example 3.

What is claimed is:

1. A process for the deposition on a substrate of a thin film of a compound containing at least one cationic constituent C and at least one anionic constituent A, wherein it comprises forming on said substrate at least two superimposed ionic layers respectively containing the cationic constituent or constituents C and the anionic constituent or constituents A by successive immersions of the substrate in at least one first solution containing at least one salt, a complex or an ionized compound of said cationic constituent or constituents C or a precursor of said cationic constituent or constituents C, and at least one second solution containing at least one salt, a complex or an ionized compound of said anionic constituent or constituents A or a precursor of said anionic constituent or constituents A, said substrate undergoing rinsing by a solvent between two immersions.

2. A process according to claim 1, wherein it comprises at least one cycle incorporating the following successive stages:
   immersion of said substrate in a first solution of a salt, a complex or an ionized compound of said cationic constituent,
   rinsing said substrate with a solvent,
   immersion of said substrate in a second solution of a salt, compound or an ionized complex of said anionic constituent,
   rinsing said substrate in a solvent.

3. A process according to claim 1, wherein the ionic layer containing said cationic constituent is formed by immersions of the substrate in a first solution of a salt, a compound or an ionized complex of a precursor of said cationic constituent, followed by the rinsing of said substrate with a solvent and an immersion of the rinsed substrate in a solution containing an oxydizing or reducing agent able to convert the precursor into said cationic constituent.

4. A process according to claim 1, wherein the ionic layer of said anionic constituent is formed by immersing the substrate in a second solution of a salt, a complex or an ionized compound of a precursor of said anionic constituent, followed by rinsing the substrate with a solvent and immersing the rinsed substrate in a solution containing a oxydizing or reducing agent able to convert said precursor into said anionic constituent.

5. A process according to claim 1, wherein the first solution contains a cationic dopant or a precursor of a cationic dopant.

6. A process according to claim 1, wherein the second solution contains an anionic dopant or a precursor of an anionic dopant.

7. A process according to claim 1, wherein on the substrate is also formed an ionic layer having an anionic or cationic dopant by immersing the substrate in a third solution of a salt, a complex or an ionized compound of said dopant or a precursor of said dopant.

8. A process according to claim 2, wherein it comprises at least one further cycle having the stages of immersing the substrate in a third solution of a salt, a complex or an ionized compound of a cationic or anionic dopant and rinsing said substrate with a solvent.

9. A process according to claim 1, wherein the substrate is negatively polarized during the immersion of the substrate in a first solution.

10. A process according to claim 8, wherein the substrate is negatively polarized during the immersion of the substrate in the third solution when the latter contains a cationic dopant or a precursor of a cationic dopant.

11. A process according to claim 1, wherein the substrate is positively polarized during the immersion of said substrate in the second solution.

12. A process according to claim 8, wherein the substrate is positively polarized during the immersion of the substrate in the third solution, when the latter contains an anionic dopant or a precursor of an anionic dopant.

13. Process according to either of the claims 1 and 8, wherein the rinsing solvent is water.

14. A process according to either of the claims 1 and 8, wherein said solutions are aqueous solutions.

15. A process according to claim 14, wherein the concentrations of said solutions in salt, compound or complex are $10^{-3}$ to 1 mol.l$^{-1}$.

16. A process according to either of the claims 1 and 8, wherein the substrate immersion time in each of the solutions is 5 to 120 s.

17. A process according to either of the claims 1 and 8, wherein the duration of each rinsing is 60 to 120 s.

18. A process according to claim 1, wherein the compound to be deposited is chosen from among the chalcogenides, oxides, hydroxides, phosphates, chromates, molybdates, titanates, vanadadates, tungstates, silicates, carbonates and oxalates of a metallic nature.

19. A process according to claim 1, wherein the substrate is made from metal or a plastic material.

20. A process according to claim 1 for depositing epitaxial layers on a substrate, wherein a moncrystalline substrate made from said compound and having a given orientation is used.

21. A process according to claim 1 for depositing epitaxial layers on a substrate, wherein a monocrystalline substrate made from a material differing from the compound to be deposited is used, but has the same crystal mesh as the compound to be deposited.

22. A process according to claim 21, wherein the monocrystalline substrate is made from metal, a semiconductor material or a dielectric material.

* * * * *